(12) United States Patent
Kato et al.

(10) Patent No.: US 9,136,228 B2
(45) Date of Patent: Sep. 15, 2015

(54) ESD PROTECTION DEVICE

(71) Applicant: Murata Manufacturing Co., Ltd., Nagaokakyo-shi, Kyoto-fu (JP)

(72) Inventors: Noboru Kato, Nagaokakyo (JP); Jun Sasaki, Nagaokakyo (JP); Kosuke Yamada, Nagaokakyo (JP); Satoshi Ishino, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/689,983

(22) Filed: Nov. 30, 2012

(65) Prior Publication Data

US 2013/0099353 A1    Apr. 25, 2013

Related U.S. Application Data

(63) Continuation of application No. PCT/JP2011/061926, filed on May 25, 2011.

(30) Foreign Application Priority Data

Jun. 2, 2010 (JP) ................. 2010-126999

(51) Int. Cl.
*H01L 27/08* (2006.01)
*H01L 23/60* (2006.01)
(Continued)

(52) U.S. Cl.
CPC ............ *H01L 23/60* (2013.01); *H01L 24/05* (2013.01); *H01L 24/06* (2013.01);
(Continued)

(58) Field of Classification Search
CPC . H01L 23/60; H01L 27/0296; H01L 27/0248; H01L 28/10

USPC .......................................................... 257/531
See application file for complete search history.

(56) References Cited

U.S. PATENT DOCUMENTS 5,821,626 A * 10/1998 Ouchi et al. .................. 257/778
6,458,622 B1   10/2002 Keser et al.
(Continued)

FOREIGN PATENT DOCUMENTS

JP    63-244681 A    10/1988
JP    04-146660 A    5/1992
(Continued)

OTHER PUBLICATIONS

Official Communication issued in International Patent Application No. PCT/JP2011/061926, mailed on Jul. 19, 2011.

*Primary Examiner* — Jarrett Stark
*Assistant Examiner* — Mohammad M Hoque
(74) *Attorney, Agent, or Firm* — Keating & Bennett, LLP

(57) ABSTRACT

An ESD protection device includes a semiconductor substrate including input/output electrodes and a rewiring layer provided on a surface of the semiconductor substrate. An ESD protection circuit is provided on or in an outer layer of the semiconductor substrate, and the input/output electrodes are connected to the ESD protection circuit. The rewiring layer includes interlayer wiring lines, in-plane wiring lines, and post electrodes. First ends of the interlayer wiring lines disposed in the thickness direction are connected to the input/output electrodes disposed on the surface of the semiconductor substrate, and second ends of the interlayer wiring lines are connected to first ends of the in-plane wiring lines routed in plan view. Prismatic post electrodes are provided between second ends of the in-plane wiring lines and terminal electrodes.

10 Claims, 12 Drawing Sheets

(51) Int. Cl.
   *H01L 23/00*      (2006.01)
   *H01L 27/02*      (2006.01)
   *H01L 49/02*      (2006.01)

(52) U.S. Cl.
   CPC .......... *H01L 27/0296* (2013.01); *H01L 28/10* (2013.01); *H01L 28/20* (2013.01); *H01L 24/13* (2013.01); *H01L 24/16* (2013.01); *H01L 27/0248* (2013.01); *H01L 2224/0401* (2013.01); *H01L 2224/05016* (2013.01); *H01L 2224/05655* (2013.01); *H01L 2224/06051* (2013.01); *H01L 2224/131* (2013.01); *H01L 2224/16225* (2013.01); *H01L 2224/16227* (2013.01); *H01L 2224/81192* (2013.01); *H01L 2924/0102* (2013.01); *H01L 2924/014* (2013.01); *H01L 2924/01004* (2013.01); *H01L 2924/01005* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01041* (2013.01); *H01L 2924/01051* (2013.01); *H01L 2924/01057* (2013.01); *H01L 2924/01079* (2013.01); *H01L 2924/07802* (2013.01); *H01L 2924/12032* (2013.01); *H01L 2924/30107* (2013.01)

(56) References Cited

U.S. PATENT DOCUMENTS

| | | | | |
|---|---|---|---|---|
| 6,674,162 | B2 * | 1/2004 | Takao | 257/700 |
| 6,770,971 | B2 * | 8/2004 | Kouno et al. | 257/734 |
| 6,828,510 | B1 * | 12/2004 | Asai et al. | 174/255 |
| 6,852,616 | B2 * | 2/2005 | Sahara et al. | 438/613 |
| 7,618,886 | B2 * | 11/2009 | Jobetto et al. | 438/613 |
| 7,932,170 | B1 * | 4/2011 | Huemoeller et al. | 438/613 |
| 8,072,068 | B2 * | 12/2011 | Sakamoto | 257/737 |
| 8,089,777 | B2 * | 1/2012 | Negishi | 361/783 |
| 8,158,508 | B2 * | 4/2012 | Lin et al. | 438/614 |
| 8,187,965 | B2 * | 5/2012 | Lin et al. | 438/617 |
| 8,368,213 | B2 * | 2/2013 | Lee et al. | 257/738 |
| 2001/0019496 | A1 | 9/2001 | Wang | |
| 2003/0134455 | A1 * | 7/2003 | Cheng et al. | 438/125 |
| 2003/0230804 | A1 * | 12/2003 | Kouno et al. | 257/734 |
| 2004/0084770 | A1 | 5/2004 | Skocki | |
| 2005/0098891 | A1 * | 5/2005 | Wakabayashi et al. | 257/758 |
| 2005/0121688 | A1 * | 6/2005 | Nagai et al. | 257/99 |
| 2005/0253264 | A1 * | 11/2005 | Aiba et al. | 257/738 |
| 2008/0049155 | A1 * | 2/2008 | Yagi et al. | 349/39 |
| 2008/0088322 | A1 * | 4/2008 | Nagai | 324/671 |
| 2008/0238604 | A1 * | 10/2008 | Sato et al. | 338/21 |
| 2008/0296684 | A1 * | 12/2008 | Nozu | 257/355 |
| 2010/0020454 | A1 * | 1/2010 | Hirobe et al. | 361/56 |
| 2010/0038799 | A1 * | 2/2010 | Ito | 257/773 |
| 2011/0215358 | A1 * | 9/2011 | Hwang et al. | 257/98 |
| 2012/0146181 | A1 * | 6/2012 | Lin et al. | 257/531 |
| 2012/0193788 | A1 * | 8/2012 | Fu et al. | 257/738 |

FOREIGN PATENT DOCUMENTS

| | | |
|---|---|---|
| JP | 2001-057374 A | 2/2001 |
| JP | 2001-110836 A | 4/2001 |
| JP | 2001-244418 A | 9/2001 |
| JP | 2004-158758 A | 6/2004 |
| JP | 2005-026434 A | 1/2005 |
| JP | 2006-505955 A | 2/2006 |
| JP | 2007-013031 A | 1/2007 |
| JP | 2010-87113 A | 4/2010 |

* cited by examiner

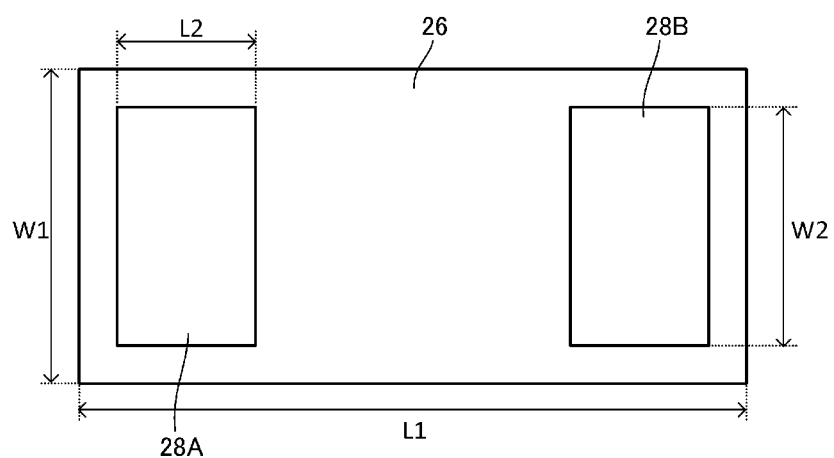

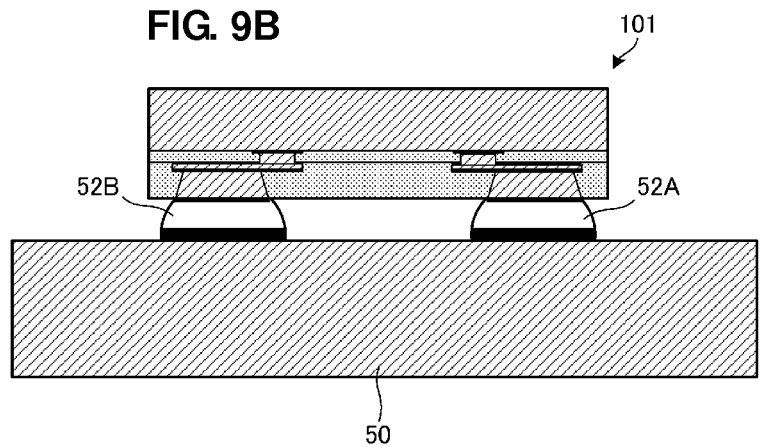

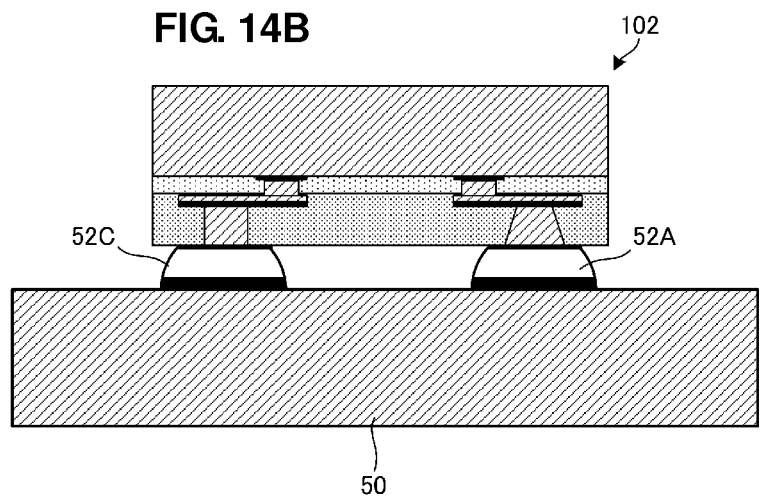

ESD PROTECTION DEVICE

BACKGROUND OF THE INVENTION

1. Field of the Invention

The present invention relates to ESD protection devices for protecting semiconductor ICs and other electronic components against static electricity, and more specifically, to a chip size package (CSP-type) ESD protection device including a functional portion provided on a silicon substrate.

2. Description of the Related Art

Various electric apparatuses, such as mobile communication terminals, digital cameras, and notebook PCs include semiconductor integrated circuits (IC chips) which define logic circuits, memory circuits, and other circuits. Such semiconductor integrated circuits are constant-voltage driving circuits that include fine wiring patterns which are provided on a semiconductor substrate, and are therefore vulnerable to an electrostatic discharge, such as a surge. Such semiconductor integrated circuits are protected against electrostatic discharges using ESD (Electro-Static-Discharge) protection devices.

As described in Japanese Unexamined Patent Application Publication No. 4-146660, Japanese Unexamined Patent Application Publication No. 2001-244418, Japanese Unexamined Patent Application Publication No. 2007-013031, and Japanese Unexamined Patent Application Publication No. 2004-158758, ESD protection devices including ESD protection circuits that include diodes that are provided in semiconductor substrates are widely used. The protection provided by a diode in an ESD protection circuit is achieved by utilizing a breakdown phenomenon that occurs at the time when a reverse direction voltage is applied to the diode, and the breakdown voltage functions as an operating voltage.

Japanese Unexamined Patent Application Publication No. 2004-158758 discloses an example of a semiconductor device including a rewiring line used to form an ESD protection device as a surface mount device. Here, a configuration of the ESD protection device disclosed in Japanese Unexamined Patent Application Publication No. 2004-158758 will be described with reference to FIG. 1. FIG. 1 is a cross-sectional view of a semiconductor device that defines the ESD protection device disclosed in Japanese Unexamined Patent Application Publication No. 2004-158758. The semiconductor device includes a silicon substrate (semiconductor substrate) 1. An integrated circuit is disposed in a center portion on the top surface of the silicon substrate 1, and a plurality of connection pads 2 connected to the integrated circuit are disposed in a periphery on the top surface. An insulating film 3 made of silicon oxide is disposed on the top surface of the silicon substrate 1, except for center portions of the connection pads 2. The center portions of the connection pads 2 are exposed through openings 4 provided in the insulating film 3.

A protective film (insulating film) 5 made of organic resin, such as polyimide, is disposed on the top surface of the insulating film 3. The protective film 5 includes openings 6 in portions thereof corresponding to the openings 4 in the insulating film 3. The protective film 5 includes recessed portions 7 disposed in a rewiring forming region on the top surface thereof. The recessed portions 7 communicate with the openings 6.

A rewiring line 8 including an underlying metal layer 8a and an upper metal layer 8b disposed on top of the underlying metal layer 8a is arranged so as to extend from the top surfaces of the connection pads 2 exposed through the openings 4 and 6 to predetermined portions on the top surface in the recessed portions 7 in the protective film 5.

Pillar-shaped electrodes 10 are disposed on the top surfaces of connection pad portions in the rewiring line 8. A sealing film 11 is disposed on the top surface of the protective film 5, which includes the rewiring line 8, so that the top surface of the sealing film 11 is flush with the top surfaces of the pillar-shaped electrodes 10. Solder balls 12 are disposed on the top surfaces of the pillar-shaped electrodes 10.

Meanwhile, if the above-described ESD protection device is disposed in a high-frequency circuit, a problem occurs in that high-frequency signals are affected by the parasitic capacitance of the diode. That is, the insertion of an ESD protection device into a signal line may cause impedance variations due to the parasitic capacitance of the diode, which results in signal loss.

SUMMARY OF THE INVENTION

Preferred embodiments of the present invention provide an ESD protection device in which the influence of the parasitic capacitance of a diode is reduced and degradation in circuit characteristics is reduced.

An ESD protection device according to a preferred embodiment of the present invention includes a semiconductor substrate which includes an ESD protection circuit including a diode and input/output electrodes that are electrically connected to the ESD protection circuit, and a rewiring layer including pillar-shaped post electrodes electrically connected to the input/output electrodes and terminal electrodes, wherein when a distance in a radial direction from a center axis of each of the post electrodes to a side surface of the post electrode is represented by R and an azimuth in the radial direction is represented by $\theta$, $\theta$ has a range over which $dR/d\theta$ at the same height is not 0.

For example, at least one $\theta$ for which $dR/d\theta$ at the same height changes discontinuously with respect to $\theta$ is obtained.

Preferably, each of the post electrodes has a polygonal cross-section taken in a plane perpendicular to the center axis.

Preferably, each of the post electrodes has a larger cross-sectional area (transverse cross-sectional area) taken in the plane perpendicular to the center axis on the terminal electrode side than on the input/output electrode side.

For example, the transverse cross-sectional areas of the post electrodes are configured to increase in a continuous manner or in incremental steps from the input/output electrodes to the terminal electrodes.

Preferably, the rewiring layer includes a plurality of the post electrodes, and an interval between adjacent post electrodes among the post electrodes is greater than an interval between interlayer wiring lines connected to the input/output electrodes.

In addition, for example, an insulating layer is provided on the semiconductor substrate, in-plane wiring lines electrically connected to the post electrodes are provided on the insulating layer, and interlayer wiring lines that connect the input/output electrodes and the in-plane wiring lines are provided in the insulating layer.

In addition, the terminal electrodes preferably include at least three terminal electrodes, and a resistor or an inductor connected between two terminal electrodes used for a signal line among the terminal electrodes is provided in the rewiring layer, the post electrodes are electrically connected to the terminal electrodes used for the signal line, and one of the post electrodes that is electrically connected to a terminal electrode used for a ground terminal among the plurality of terminal electrodes is configured to have a cylindrical or substantially cylindrical shape.

According to various preferred embodiments of the present invention, the inductance component of a post electrode in a rewiring layer can be increased in the high-frequency band, and the capacitance of a diode in an ESD protection circuit can be reduced. As a result, an ESD protection device with low loss for high-frequency signals without a reduction in ESD protection performance is achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2B is a bottom view of the ESD protection device 101.

FIG. 9B is a diagram illustrating a configuration of the ESD protection device 101 which is packaged on the printed wiring board.

FIG. 14B is a diagram illustrating a configuration of the ESD protection device 102 which is packaged on the printed wiring board.

DETAILED DESCRIPTION OF THE PREFERRED EMBODIMENTS

First Preferred Embodiment

An ESD protection device according to a first preferred embodiment of the present invention will be described with reference to the drawings.

Figure 1:
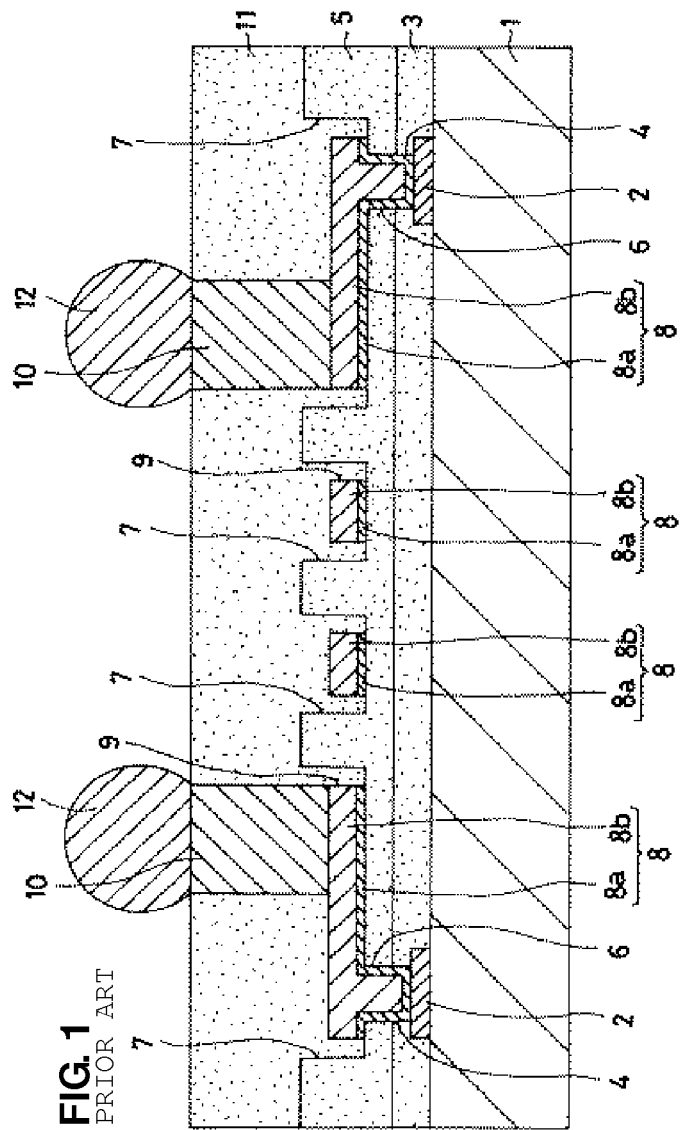
FIG. 1 is a cross-sectional view of a semiconductor device defining an ESD protection device disclosed in Japanese Unexamined Patent Application Publication No. 2004-158758.
Figure 2A:
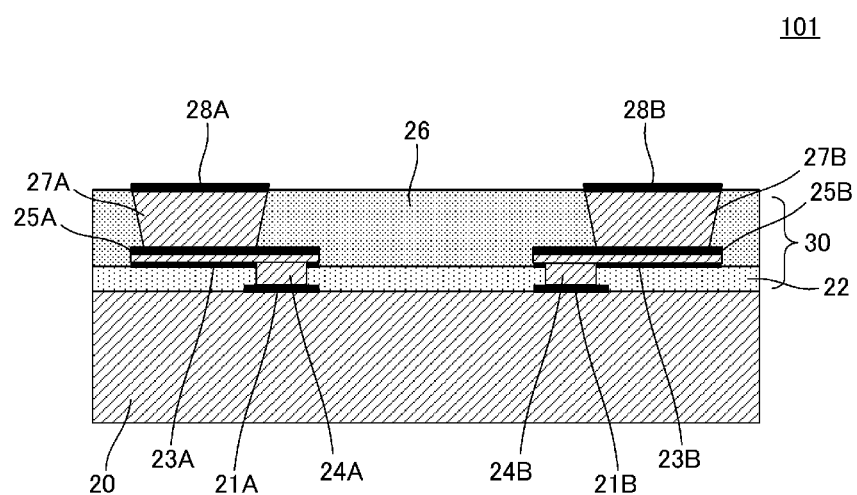
FIG. 2A is a cross-sectional view of a main portion of an ESD protection device 101 according to a first preferred embodiment of the present invention.
Figure 3:
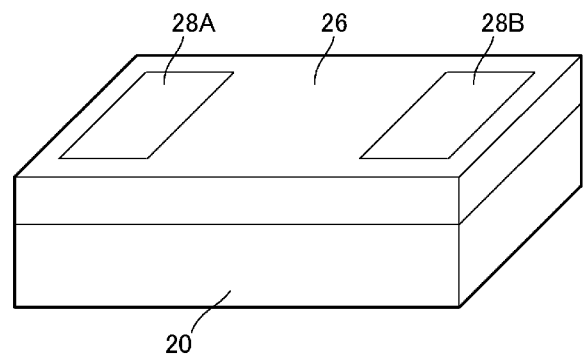
FIG. 3 is a perspective view of the ESD protection device 101.

FIG. 2A is a cross-sectional view of a main portion of an ESD protection device 101 according to the first preferred embodiment. FIG. 2B is a bottom view of the ESD protection device 101. Further, FIG. 3 is a perspective view of the ESD protection device 101, and FIGS. 4A and 4B include a perspective view and a cross-sectional view of a post electrode.

As illustrated in FIG. 2A, the ESD protection device 101 includes a semiconductor substrate 20 including input/output electrodes 21A and 21B, and a rewiring layer 30 provided on a surface of the semiconductor substrate 20. Although not shown in FIG. 2A, an ESD protection circuit is formed on or in an outer layer of the semiconductor substrate 20, and the input/output electrodes 21A and 21B are connected to the ESD protection circuit. The rewiring layer 30 includes interlayer wiring lines 24A and 24B, in-plane wiring lines 25A and 25B, and post electrodes 27A and 27B.

First ends of the interlayer wiring lines 24A and 24B disposed in the thickness direction are connected to the input/output electrodes 21A and 21B disposed on the surface of the semiconductor substrate 20, and second ends of the interlayer wiring lines 24A and 24B are connected to first ends of the in-plane wiring lines 25A and 25B which are routed in plan view. Second ends of the in-plane wiring lines 25A and 25B are connected to first ends of the post electrodes 27A and 27B disposed in the thickness direction.

As illustrated in FIG. 2B, two rectangular terminal electrodes 28A and 28B are provided on the bottom surface side of the ESD protection device 101. That is, the bottom surface of the ESD protection device 101 preferably has a rectangular shape having long sides (dimension: L1) and short sides (dimension: W1), and each of the terminal electrodes 28A and 28B also preferably has a rectangular shape having long sides (dimension: W2) and short sides (dimension: L2), for example. The short sides of the terminal electrodes 28A and 28B are parallel or substantially parallel to the long sides of the ESD protection device, and the long sides of the terminal electrodes 28A and 28B are parallel or substantially parallel to the short sides of the ESD protection device 101.

The ESD protection device 101 includes diodes, such as Schottky barrier diodes, for example, which are connected to the input/output electrodes 21A and 21B. Each input/output electrode is preferably defined by an aluminum pad (Al pad), for example. An inorganic insulating layer 22 preferably made of $SiO_2$, for example, is disposed on the surface of the semiconductor substrate 20 in which the ESD protection circuit is provided. The inorganic insulating layer 22 includes openings in portions thereof at which where the Al pads are provided. A UBM (Under Bump Metal) layer preferably made of Ti and Cu, for example, is provided in the openings and in areas surrounding the openings. The UBM layer defines the interlayer wiring lines 24A and 24B. The in-plane wiring lines 25A and 25B, which are preferably composed of Cu, for example, are disposed on a surface of the UBM layer. The in-plane wiring lines 25A and 25B are routed so that the adjacent post electrodes 27A and 27B are arranged in directions such that they are spaced apart from each other.

Insulating adhesive layers 23A and 23B preferably made of polyimide, for example, are provided between the in-plane wiring line 25A and the inorganic insulating layer 22 and between the in-plane wiring line 25B and the inorganic insulating layer 22 to improve contact between each of the in-plane wiring lines 25A and 25B and the inorganic insulating layer 22.

When the in-plane wiring lines 25A and 25B include first ends and second ends which are represented by first regions and second regions, respectively, the first regions are regions connected to the interlayer wiring lines 24A and 24B, and the second regions are regions connected to the post electrodes 27A and 27B. Each of the post electrodes 27A and 27B is arranged to stand up like a pillar in an organic insulating film 26 preferably made of epoxy-based resin, for example, and extends in a direction perpendicular or substantially perpendicular to the main surface of the semiconductor substrate 20.

Figure 4A:
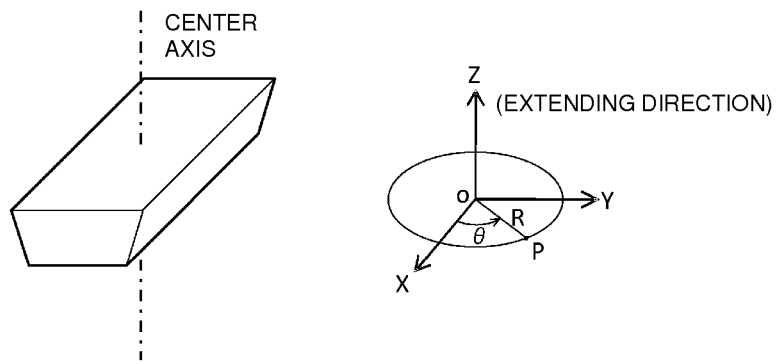
FIGS. 4A and 4B are a perspective view and a cross-sectional view of a post electrode in the ESD protection device 101.
Figure 4B:
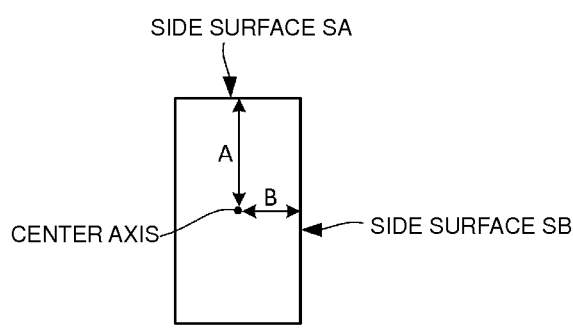

As illustrated in FIG. 3 and FIGS. 4A and 4B, the post electrodes 27A and 27B each preferably have a trapezoidal cross-section parallel or substantially parallel to a post electrode extending direction (thickness direction) such that the area thereof on the in-plane wiring line 25A and 25B side is smaller and the area thereof on the terminal electrode 28A and 28B side is larger. In addition, each of the post electrodes 27A and 27B includes a plurality of side surfaces that are different distances from the center axis thereof. Specifically, as illustrated in FIG. 4B, the post electrodes 27A and 27B each preferably include side surfaces SA which are located at a distance A from the center axis and side surfaces SB which are located at a distance B from the center axis, wherein distance A>distance B, when viewing a cross section taken in a direction perpendicular or substantially perpendicular to the extending direction (thickness direction).

The center axes are each a line connecting the center (centroid) of the end surface of the post electrode on the in-plane wiring line 25A and 25B side and the center (centroid) of the end surface of the post electrode on the terminal electrode 28A and 28B side.

The cross section of each of the post electrodes 27A and 27B taken in the direction perpendicular or substantially perpendicular to the extending direction is not limited to a rectangular shape, such as a square or a rectangle, and may be an ellipse or a circle having a portion thereof cut off by a straight line. In essence, when viewed at the same height, a post electrode having side surfaces which are located at different distances in the radial direction from the center axis extending in the height direction to the side surfaces may be used. When the point at which the center axis (Z axis) and the cross section (X-Y plane) perpendicular or substantially perpendicular to the Z axis intersect is represented by the origin O, an initial line OX is taken, and the coordinates of a point P on the side surface are expressed as $(R, \theta)$, where R (the length of the straight line OP) represents the distance in the radial direction from the center axis of the post electrode to the point P and $\theta$ (the angle defined between the straight line OP and the initial line OX) represents the azimuth in the radial direction, $\theta$ may have a range over which $dR/d\theta$ at the same height is not 0.

Preferably, a post electrode is configured to have a discontinuous surface on at least a portion of a side surface thereof in order to achieve the increase in inductance value over the same high-frequency band. That is, preferably, at least one $\theta$ for which $dR/d\theta$ at the same height changes discontinuously with respect to $\theta$ is obtained.

In addition, the transverse cross-sections of the post electrodes 27A and 27B may preferably be shaped so as to increase in incremental steps from the input/output electrodes 21A and 21B to the terminal electrodes 28A and 28B.

Each of the post electrodes 27A and 27B preferably includes a metal plating film of, for example, Ni/Au, Ni/Sn, or other suitable metal plating film, on the terminal electrode 28A and 28B side, that is, on the surface side to be connected to a motherboard, such as a printed wiring board, for example. The metal plating film provided on the surface of the post electrode 27A defines the terminal electrode 28A, which is used for a signal line, and the metal plating film provided on the surface of the post electrode 27B defines the terminal electrode 28B, which is used for a ground terminal.

Figure 5:
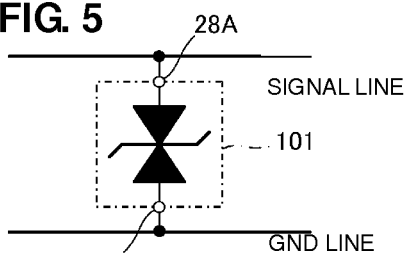
FIG. 5 is an example circuit diagram of a circuit that includes the ESD protection device 101 according to the first preferred embodiment of the present invention.
Figure 6:
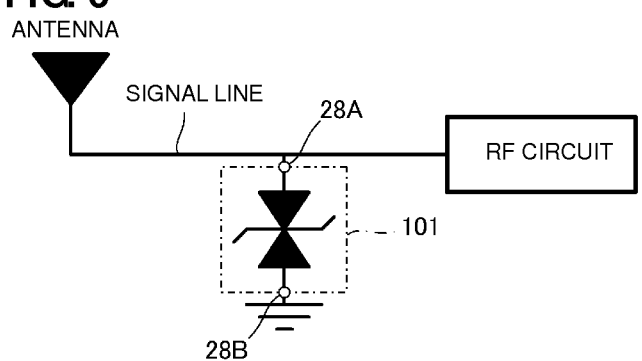
FIG. 6 is an example circuit diagram of a circuit in which the ESD protection device 101 according to the first preferred embodiment of the present invention is included in an antenna portion.

FIG. 5 is an example of a circuit diagram of a circuit to which the ESD protection device 101 according to the first preferred embodiment is applied. FIG. 6 illustrates an example of a circuit diagram of a circuit in which the ESD protection device 101 is applied to an antenna portion.

The ESD protection device 101 defines an ESD protection circuit in which two Schottky barrier diodes are connected in series face-to-face. As illustrated in FIG. 5, the ESD protection device 101 is connected between a signal line and a GND line. For example, in the example in FIG. 6, the terminal electrode 28A of the ESD protection device 101, which is used for a signal line, is connected to the signal line, and the terminal electrode 28B, which is used for a ground terminal, is connected to the GND so as to arrange the ESD protection device between an antenna and an RF circuit. Therefore, an ESD transient current entering from the antenna is shunted to ground, and the voltage at the signal line can be clamped to a safe level.

Figure 7A:
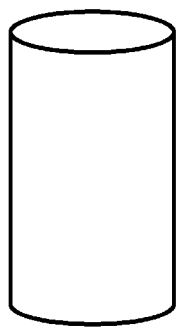
FIGS. 7A to 7C are diagrams illustrating a difference in the effect of inductance which is caused by the difference in the shape of post electrodes.
Figure 7B:
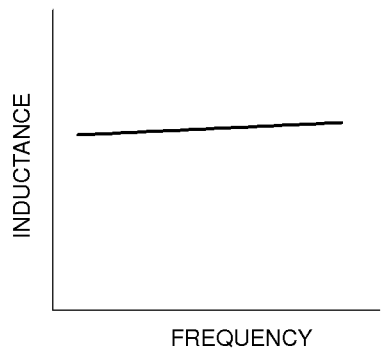
Figure 7C:
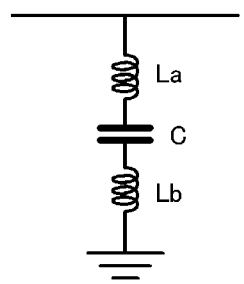
Figure 8A:
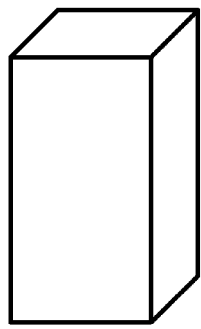
FIGS. 8A to 8C include diagrams illustrating a difference in the effect of inductance which is caused by the difference in the shape of post electrodes.
Figure 8B:
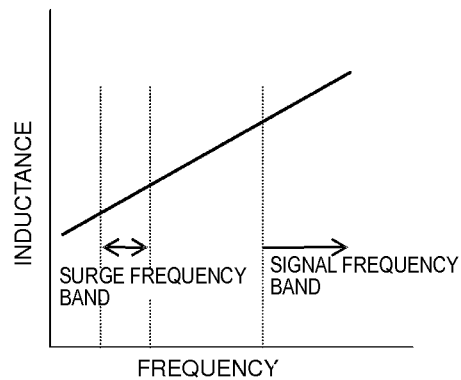
Figure 8C:
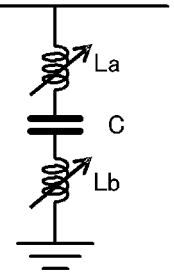

FIGS. 7A to 8C are diagrams illustrating differences in the effect of inductance which is caused by the differences in the shape of post electrodes. FIG. 7A is a perspective view of a cylindrical post electrode, FIG. 7B is a frequency characteristic diagram of the inductance of the post electrode, and FIG. 7C is an equivalent circuit diagram of an ESD protection device including the post electrode illustrated in FIG. 7A. FIG. 8A is a perspective view of a prismatic post electrode, FIG. 8B is a frequency characteristic diagram of the inductance of the post electrode, and FIG. 8C is an equivalent circuit diagram of an ESD protection device including the post electrode illustrated in FIG. 8A.

As illustrated in FIG. 7A, if the post electrode has a cylindrical shape having a uniform distance in the radial direction from the center axis thereof to the side surface thereof, the skin effect causes a high-frequency current to primarily flow through the skin of the side surface of the post electrode. Skin depth depends on frequency while the inductance of the post electrode does not significantly depend on skin depth. Therefore, as illustrated in FIG. 7B, the inductance value of the post electrode does not significantly depend on frequency. In the equivalent circuit illustrated in FIG. 7C, inductors La and Lb are inductance components of the post electrodes 27A and 27B. A capacitor C is the parasitic capacitance of the Schottky barrier diodes illustrated in FIG. 5.

In contrast, as illustrated in FIG. 8A, if the post electrode has a rectangular prism shape, the skin effect causes a high-frequency current to concentrate in the ridges thereof as frequency increases. Therefore, as illustrated in FIG. 8B, the inductance value of the post electrode is small in a low-frequency region (surge frequency) but is large in a high-frequency region (signal frequency band). Thus, in the equivalent circuit illustrated in FIG. 8C, inductors La and Lb have large values in the signal frequency band, and the influence of a capacitor (parasitic capacitance) C is reduced. That is, the capacitive reactance of an ESD protection device can be reduced. As a result, an ESD protection device with low loss for high-frequency signals which can solve inductance mismatch without a reduction in ESD protection performance is achieved.

In this manner, if a post electrode is configured to have surfaces that are different distances in the radial direction from the center axis thereof, the post electrode exhibits a relatively large inductance value in the signal frequency band. For this reason, with the use of the post electrode having the shape illustrated in FIG. 4A, the capacitive reactance of the ESD protection device 101 in the signal frequency band can be reduced (compared to the case in which a cylindrical post electrode is used).

Figure 9A:
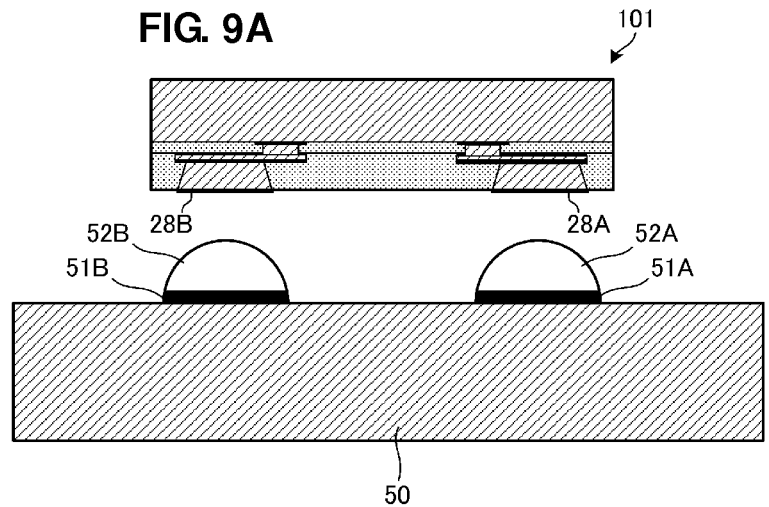
FIG. 9A is a diagram illustrating a configuration of the ESD protection device 101 and a printed wiring board on which the ESD protection device 101 is to be packaged.

FIG. 9A is a diagram illustrating a configuration of the ESD protection device 101 and a printed wiring board on which the ESD protection device 101 is to be packaged, and FIG. 9B is a diagram illustrating a configuration of the ESD protection device 101 which is packaged on the printed wiring board.

As illustrated in FIG. 9A and FIG. 9B, the ESD protection device 101 is mounted on and fixed to pad electrodes 51A and 51B on a printed wiring board 50 through solders 52A and 52B provided on the pad electrodes 51A and 51B, respectively, using a reflow soldering method or other suitable soldering method, for example. The ESD protection device 101 is an example configured as a single-channel product, and exerts an ESD protection function on a single signal line.

In this manner, a post electrode in the rewiring layer 30 preferably has a pillar shape having a rectangular cross-section. Thus, the inductance component of the post electrode can be increased in the signal frequency band, and the parasitic capacitance of a diode in the ESD protection circuit can be reduced. As a result, a low-loss, compact, thin ESD protection device having a small parasitic capacitance for high-frequency signals without reduction in ESD protection performance is achieved.

In addition, if a post electrode has a discontinuous surface on at least a portion of the surface thereof (that is, an angled portion or a corner portion), the frequency dependency upon the inductance value of the post electrode is increased.

Furthermore, it is preferable that a conductor portion in the rewiring layer 30 is defined by the interlayer wiring lines 24A and 24B whose ends are connected to the input/output electrodes 21A and 21B, the in-plane wiring lines 25A and 25B whose ends are connected to the other ends of the interlayer wiring lines 24A and 24B, and the post electrodes 27A and 27B connected to the other ends of the in-plane wiring lines 25A and 25B, because the positional flexibility of the post electrodes 27A and 27B is increased and the flexibility in the shape of the post electrodes 27A and 27B is also increased accordingly. In this example, the interval between the post electrodes 27A and 27B is preferably set to be greater than the interval between the interlayer wiring lines 24A and 24B connected to the input/output electrodes 21A and 21B, respectively. This reduces the capacitance generated between the post electrodes 27A and 27B, and an ESD protection device having small capacitive components is achieved.

Furthermore, as illustrated in FIG. 2A, the cross-sectional areas of the post electrodes 27A and 27B in the plane perpendicular or substantially perpendicular to their center axes are greater on the terminal electrode 28A and 28B side than on the in-plane wiring line 25A and 25B side. In this example, the post electrodes 27A and 27B have a shape in which the transverse cross-sectional areas of the post electrodes 27A and 27B continuously increase from the input/output electrodes 21A and 21B to the terminal electrodes 28A and 28B. That is, the post electrodes 27A and 27B preferably have a trapezoidal cross-section parallel or substantially parallel to the post electrode extending direction (thickness direction). This configuration reduces the capacitance generated between adjacent post electrodes, compared to the case in which the overall post electrode is thin, without significantly increasing the resistance component of the post electrode. Moreover, since the joint area between a post electrode and a terminal electrode is sufficiently ensured, the reliability of the joint portion therebetween is also be ensured.

Second Preferred Embodiment

Figure 10A:
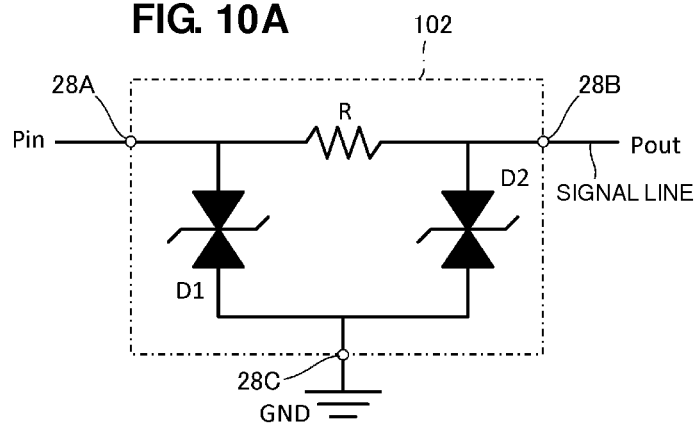
FIGS. 10A to 10C include a circuit diagram of an ESD protection device 102 according to a second preferred embodiment of the present invention and equivalent circuit diagrams thereof.
Figure 10B:
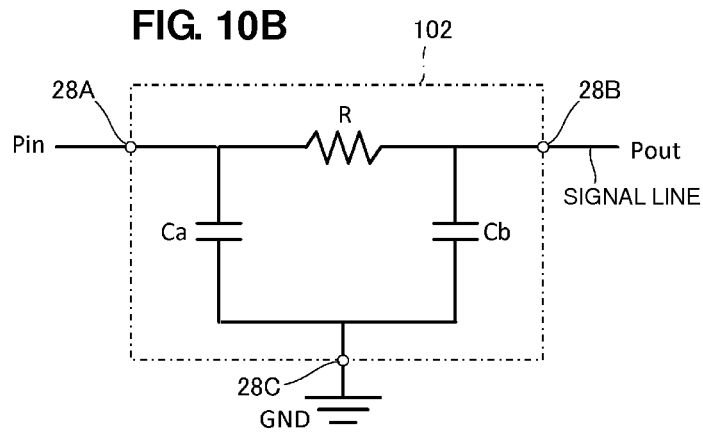
Figure 10C:
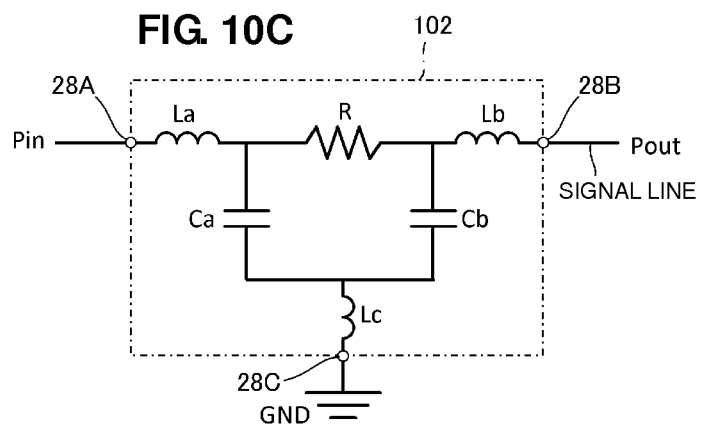

FIG. 10A is a circuit diagram of an ESD protection device 102 according to a second preferred embodiment of the present invention, and FIG. 10B and FIG. 10C are equivalent circuit diagrams thereof.

The ESD protection device 102 according to the second preferred embodiment includes a filter circuit that utilizes the parasitic capacitance of a diode. Such a filter-circuit-equipped ESD protection device is disposed in a signal line, thereby providing the functions of a low pass filter or a band pass filter in addition to the ESD protection function.

As illustrated in FIG. 10A, the ESD protection device 102 according to the second preferred embodiment includes a resistance element R disposed on a signal line, and Schottky barrier diodes D1 and D2 arranged between the signal line and a ground. The diodes D1 and D2 define an ESD protection circuit, and the parasitic capacitance of the diodes D1 and D2 and the resistance element R define a n-type low pass filter circuit. An equivalent circuit to the ESD protection device 102 can be expressed as illustrated in FIG. 10B. For example, this device may preferably be disposed in a signal line connecting an antenna and an RF circuit, thereby functioning as a low pass filter that bypasses an ESD excessive current entering from the antenna to the ground and clamps the overvoltage to a safe level while allowing signals in the desired frequency band to pass therethrough.

Meanwhile, in order to configure an ESD protection device as a surface mount device, a semiconductor chip including an ESD protection circuit provided therein is packaged. Typical semiconductor chip packaging structures include BGA (Ball Grid Array) packaging using a bonding wire, and LGA (Land Grid Array) packaging. In particular, the WL-CSP (Wafer-Level Chip Size Package) structure in which a rewiring layer is formed on a semiconductor chip using a wafer process is effective to achieve compactness. However, if this WL-CSP structure is applied to a filter-circuit-equipped ESD protection device, problems may occur in that, for example, the parasitic capacitance of the ESD protection device increases and the frequency characteristics of the filter circuit are changed depending on the structure of the rewiring layer disposed on the semiconductor chip.

That is, as disclosed above with respect to the first preferred embodiment, a post electrode includes an inductance component. An equivalent circuit in which such inductance components are taken into account is illustrated in FIG. 10C. Here, an inductor La corresponds to the inductance component of a post electrode electrically connected to a terminal electrode 28A, and an inductor Lb corresponds to the inductance component of a post electrode electrically connected to a terminal electrode 28B. Further, an inductor Lc corresponds to the inductance component of a post electrode electrically connected to a terminal electrode 28C.

In this manner, a circuit is obtained in which the common inductor Lc is disposed in the ground line by post electrodes to which the ground sides of two diodes are commonly connected. Thus, a direct wave is produced in which high frequency components in a signal input from a port Pin in the signal line are directly output to a port Pout through capacitors Ca and Cb without being dropped to the ground through the inductor Lc.

Figure 11:
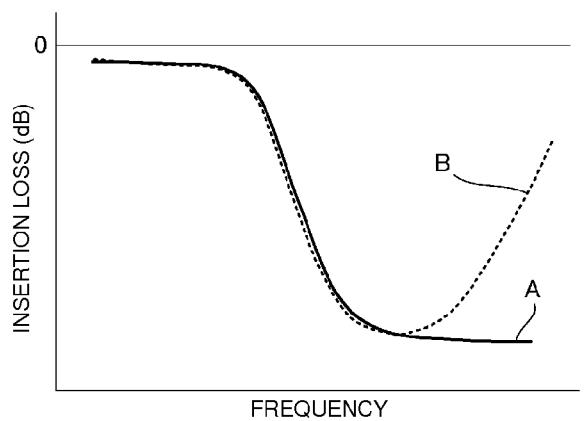
FIG. 11 is an illustration of an example of the change in insertion loss of a filter which is affected by a common inductor Lc.

FIG. 11 is an illustration of an example of frequency characteristics of insertion loss of a filter which is affected by the common inductor Lc. A curve A depicts an insertion loss characteristic when the inductance of the common inductor Lc is low, and a curve B depicts an insertion loss characteristic when the inductance of the common inductor Lc is high. In this manner, a problem occurs in that the presence of the common inductor Lc connected to the ground does not ensure a sufficient attenuation in the stop band.

The ESD protection device 102 according to the second preferred embodiment overcomes the foregoing problem.

Figure 12A:
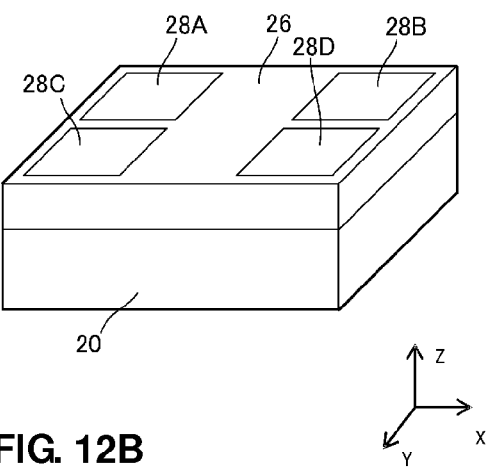
FIG. 12A is a perspective view of the ESD protection device 102 according to the second preferred embodiment of the present invention.
Figure 12B:
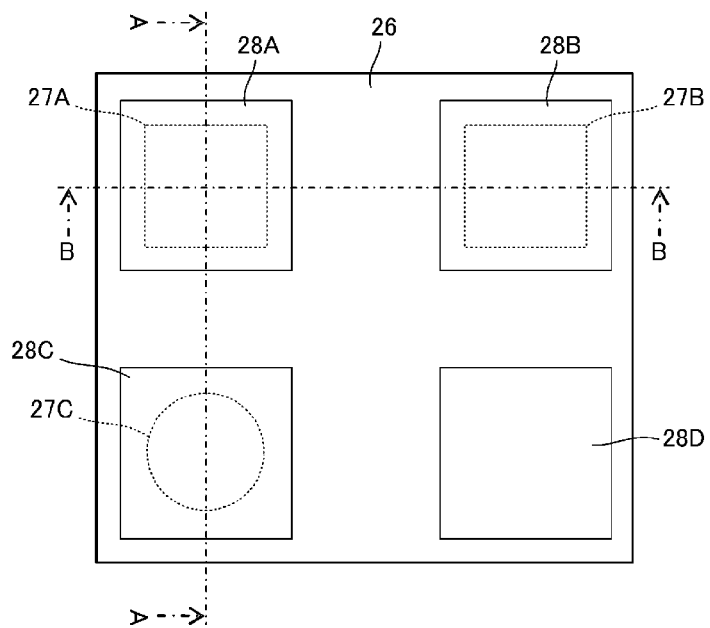
FIG. 12B is a bottom view of the ESD protection device 102 according to the second preferred embodiment of the present invention.
Figure 13A:
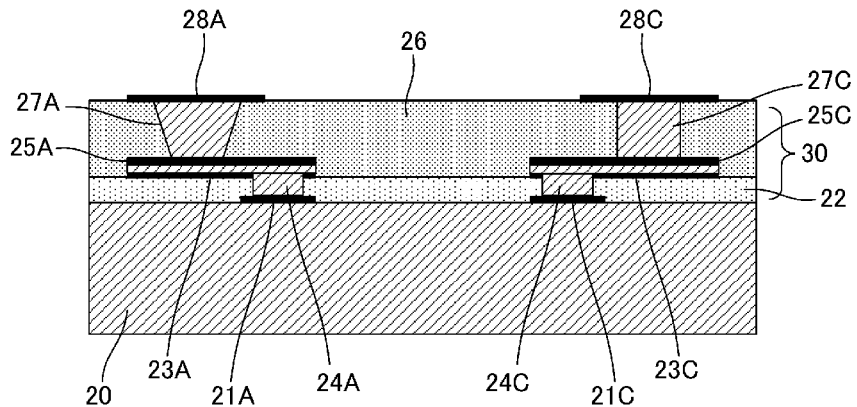
FIG. 13A is a cross-sectional view taken along line A-A in FIG. 12B.
Figure 13B:
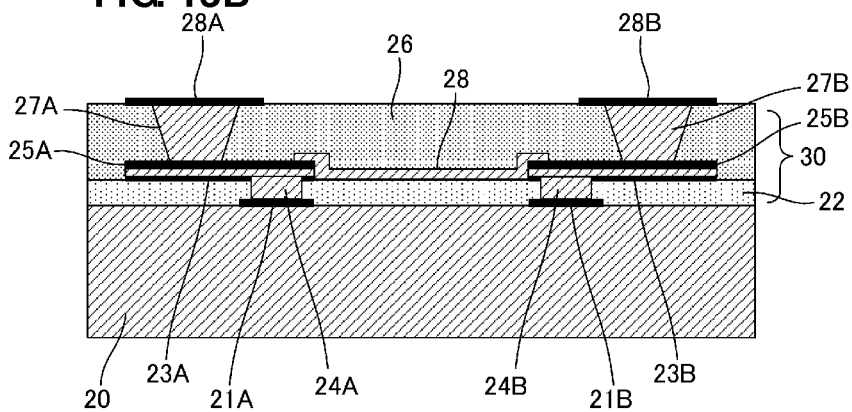
FIG. 13B is a cross-sectional view taken along line B-B in FIG. 12B.

FIG. 12A is a perspective view of the ESD protection device 102 according to the second preferred embodiment, and FIG. 12B is a bottom view thereof. Further, FIG. 13A is a cross-sectional view taken along line A-A in FIG. 12B, and FIG. 13B is a cross-sectional view taken along line B-B in FIG. 12B. FIG. 13A is a cross-sectional view taken along the plane which extends through the input/output electrodes 21A and 21C and the post electrodes 27A and 27C and which is perpendicular or substantially perpendicular to the mounting surface of the ESD protection device 102. Further, FIG. 13B is a cross-sectional view taken along the plane which extends through the input/output electrodes 21A and 21B and the post electrodes 27A and 27B and which is perpendicular or substantially perpendicular to the mounting surface of the ESD protection device 102.

An ESD protection circuit including the diodes D1 and D2 is provided in an outer layer region of the semiconductor substrate 20, and the resistance element R is provided in a rewiring layer disposed on a surface of the semiconductor substrate 20. The resistance element may be an inductance element.

As illustrated in FIG. 13A and FIG. 13B, the semiconductor substrate 20 includes on a surface thereof input/output electrodes 21A, 21B, and 21C which are connected to an ESD protection circuit. The rewiring layer 30 includes interlayer wiring lines 24A, 24B, and 24C, in-plane wiring lines 25A, 25B, and 25C, and post electrodes 27A, 27B, and 27C. First ends of the interlayer wiring lines 24A, 24B, and 24C are connected to the input/output electrodes 21A, 21B, and 21C, and second ends of the interlayer wiring lines 24A, 24B, and 24C are connected to first ends of the in-plane wiring lines 25A, 25B, and 25C. Second ends of the in-plane wiring lines 25A, 25B, and 25C are connected to one ends of the post electrodes 27A, 27B, and 27C, and second ends of the post electrodes 27A, 27B, and 27C are connected to terminal electrodes 28A, 28B, and 28C to be connected to a motherboard.

The input/output electrodes on the surface of the semiconductor substrate 20 are connected to the ESD protection circuit, and are preferably defined by aluminum pads (Al pads), for example. An inorganic insulating layer 22 preferably made of $SiO_2$, for example, is disposed on a main surface on the side of the semiconductor substrate at which the Al pads are provided, and the inorganic insulating layer 22 includes openings in portions thereof at which the Al pads are provided. A UBM (Under Bump Metal) layer preferably made of Ti and Cu, for example, is provided in the openings and in areas surrounding the openings. The UBM layer defines the interlayer wiring lines. The in-plane wiring lines 25A, 25B, and 25C, which are preferably made of Cu, for example, are disposed on a surface of the UBM layer. The in-plane wiring lines 25A, 25B, and 25C are routed so that the adjacent post electrodes 27A, 27B, and 27C are arranged in directions such that they are spaced apart from one another.

Insulating adhesive layers 23A, 23B, and 23C preferably made of polyimide, for example, are disposed between the in-plane wiring line 25A and the inorganic insulating layer 22, between the in-plane wiring line 25B and the inorganic insulating layer 22, and between the in-plane wiring line 25C and the inorganic insulating layer 22 to improve contact between each in-plane wiring line layer and the inorganic insulating layer 22.

Each of the post electrodes 27A, 27B, and 27C is caused to stand up like a pillar in an organic insulating film 26 preferably made of epoxy-based resin, for example, and extends in a direction perpendicular or substantially perpendicular to the main surface of the semiconductor substrate 20. The post electrodes 27A and 27B include non-cylindrical post electrodes 27A and 27B that connect diodes and a signal line, and a cylindrical post electrode 27C that connects a diode and the ground. The post electrodes 27A and 27B are configured to have a trapezoidal cross-section parallel or substantially parallel to the extending direction such that first ends of the post electrodes 27A and 27B have a smaller area and second ends of the post electrodes 27A and 27B have a larger area. In addition, the post electrode 27C preferably is configured so as to have surfaces that are different distances from the center axis thereof which extends in the extending direction, that is, configured in a non-cylindrical shape. In contrast, the post electrode 27C preferably has a substantially cylindrical shape.

The cross section of each of the post electrodes 27A and 27B taken in the direction perpendicular or substantially perpendicular to the extending direction is not limited to a rectangular shape, such as a square or a rectangle, and may be an ellipse or a circle having a portion thereof cut off by a straight line. Preferably, a post electrode preferably includes a discontinuous surface on at least a portion of a side surface thereof in order to achieve the increase in inductance value in the same high-frequency band.

Each of the post electrodes 27A, 27B, and 27C includes a metal plating film preferably of Ni/Au, Ni/Sn, or other suitable metal, for example, on the terminal electrode 28A, 28B, and 28C side, that is, on the surface side to be connected to a motherboard such as a printed wiring board. The metal plating films provided on the surfaces of the post electrodes 27A and 27B define the terminal electrodes 28A and 28B, which are used for a signal line, and the metal plating film provided on the surface of the post electrode 27C define the terminal electrode 28C, which is used for a ground terminal.

As illustrated in FIG. 12B, four rectangular or substantially rectangular terminal electrodes 28A, 28B, 28C, and 28D preferably are provided on the back surface side of the ESD protection device 102. The above terminal electrodes, that is, the terminal electrode 28A to be connected to the input side (Pin) of the signal line, the terminal electrode 28B to be connected to the output side (Pout) of the signal line, the ground-terminal terminal electrode 28C to be connected to the ground, and the NC (spare terminal) terminal electrode 28D, are arranged respectively in the four corners of the rectangular ESD protection device 102.

Figure 14A:
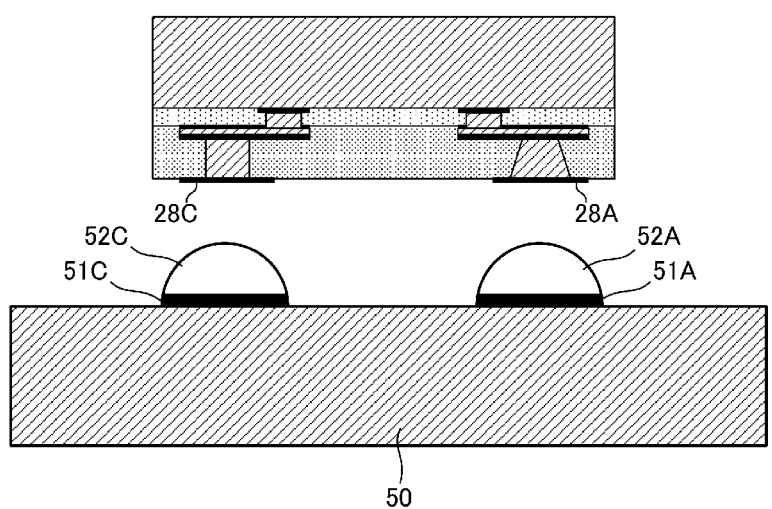
FIG. 14A is a diagram illustrating a configuration of the ESD protection device 102 and a printed wiring board on which the ESD protection device 102 is to be packaged.

FIG. 14A is a diagram illustrating a configuration of the ESD protection device 102 and a printed wiring board on which the ESD protection device 102 is to be packaged, and FIG. 14B is a diagram illustrating a configuration of the ESD protection device 102 which is packaged on the printed wiring board.

As illustrated in FIG. 14A and FIG. 14B, the ESD protection device 102 is mounted on and fixed to pad electrodes 51A, 51B on the printed wiring board 50 through solders 52A, 52B disposed on the pad electrodes 51A, 51B, respectively, using a reflow soldering method or other suitable soldering method, for example. The ESD protection device 102 is an example configured as a single-channel product, and exerts an ESD protection function on a single signal line.

In this manner, the post electrode of the ground-terminal terminal electrode 28C to be connected to the ground preferably has a cylindrical shape. Thus, the inductance value of the common inductor Lc in the equivalent circuit illustrated in FIG. 10B can be reduced, and the occurrence of the notch as indicated by the curve B illustrated in FIG. 11 can be prevented. As a result, a compact, thin ESD protection device having small parasitic capacitance for high-frequency signals while maintaining the frequency characteristics of a filter circuit is achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   a semiconductor substrate that includes an ESD protection circuit connected to a line propagating a high frequency signal and input/output electrodes electrically connected to the ESD protection circuit; and
   a rewiring layer including pillar-shaped post electrodes electrically connected to the input/output electrodes and terminal electrodes; wherein
   when a distance in a radial direction from a center axis of each of the post electrodes to a side surface of the respective post electrode is represented by R and an azimuth in the radial direction is represented by θ, θ has a range over which dR/dθ at a same height of the post electrodes is not 0;
   an inductance value of the post electrodes in a surge frequency is less than an inductance value of the post electrodes in a high frequency higher than the surge frequency; and
   each of the post electrodes is tapered in a direction from the terminal electrodes to the input/output electrodes.

2. The ESD protection device according to claim 1, wherein at least one θ for which dR/dθ at the same height changes discontinuously with respect to θ is obtained.

3. The ESD protection device according to claim 1, wherein each of the post electrodes has a polygonal cross-section taken in a plane perpendicular or substantially perpendicular to a direction in which the center axis extends.

4. The ESD protection device according to claim 1, wherein each of the post electrodes has a larger cross-sectional area taken in the plane perpendicular or substantially perpendicular to a direction in which the center axis extends on a side of the terminal electrode than on a side of the input/output electrode.

5. The ESD protection device according to claim 4, wherein the cross-sectional areas of the post electrodes increase in a continuous manner or in incremental steps from the input/output electrodes to the terminal electrodes.

6. The ESD protection device according to claim 1, wherein the rewiring layer includes a plurality of the post electrodes, and an interval between adjacent ones of the plurality of post electrodes is greater than an interval between interlayer wiring lines connected to the input/output electrodes.

7. The ESD protection device according to claim 1, wherein an insulating layer is provided on the semiconductor substrate, in-plane wiring lines electrically connected to the post electrodes are provided on the insulating layer, and interlayer wiring lines that connect the input/output electrodes and the in-plane wiring lines are provided in the insulating layer.

8. The ESD protection device according to claim 1, wherein
   the terminal electrodes include at least three terminal electrodes;
   a resistor or an inductor connected between two of the at least three terminal electrodes defining a signal line is provided in the rewiring layer;
   the post electrodes are electrically connected to the two terminal electrodes defining the signal line; and
   one of the post electrodes that is electrically connected to one of the at least three terminals defining a ground terminal has a cylindrical or substantially cylindrical shape.

9. The ESD protection device according to claim 1, wherein
   the ESD protection device has a rectangular or substantially rectangular shape including long sides and short sides;
   each of the terminal electrodes has a rectangular or substantially rectangular shape including long sides and short sides;
   the short sides of the terminal electrodes are parallel or substantially parallel to the long sides of the ESD protection device, and the long sides of the terminal electrodes are parallel or substantially parallel to the short sides of the ESD protection device.

10. The ESD protection device according to claim 1, wherein each of the post electrodes has a trapezoidal cross-section taken in a plane perpendicular or substantially perpendicular to a direction in which the center axis extends.

* * * * *